(12) United States Patent
Morita et al.

(10) Patent No.: US 8,372,575 B2
(45) Date of Patent: *Feb. 12, 2013

(54) ULTRAVIOLET-CURING RESIN MATERIAL FOR PATTERN TRANSFER AND MAGNETIC RECORDING MEDIUM MANUFACTURING METHOD USING THE SAME

(75) Inventors: Seiji Morita, Yokohama (JP); Kazuyo Umezawa, Yokohama (JP); Masatoshi Sakurai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 284 days.

This patent is subject to a terminal disclaimer.

(21) Appl. No.: 12/723,114

(22) Filed: Mar. 12, 2010

(65) Prior Publication Data

US 2010/0230384 A1  Sep. 16, 2010

(30) Foreign Application Priority Data

Mar. 13, 2009  (JP) .................................. 2009-062008

(51) Int. Cl.
*G03F 7/00* (2006.01)
*G03F 7/004* (2006.01)
*G03F 7/028* (2006.01)
*G03F 7/04* (2006.01)

(52) U.S. Cl. ..................... 430/270.1; 430/322; 430/330; 430/331; 430/913

(58) Field of Classification Search ............... 430/270.1, 430/913, 330, 331, 322
See application file for complete search history.

(56) References Cited

U.S. PATENT DOCUMENTS

| | | | |
|---|---|---|---|
| 4,832,992 A | 5/1989 | Yabe et al. | |
| 5,519,083 A | 5/1996 | Ashton et al. | |
| 6,531,261 B1 | 3/2003 | Usami et al. | |
| 6,874,262 B2 | 4/2005 | Nishiyama et al. | |
| 6,894,114 B2 | 5/2005 | Kato et al. | |
| 7,658,601 B2 * | 2/2010 | Kasumi ........................ | 425/150 |
| 7,686,972 B2 * | 3/2010 | Hieda et al. ..................... | 216/67 |
| 8,173,029 B2 * | 5/2012 | Morita et al. ................... | 216/22 |
| 2001/0036594 A1 | 11/2001 | Kozawa et al. | |
| 2002/0177070 A1 | 11/2002 | Kozawa et al. | |
| 2004/0264019 A1 | 12/2004 | Curtiss et al. | |
| 2005/0083597 A1 | 4/2005 | Gauzner et al. | |
| 2005/0256218 A1 | 11/2005 | Lachowicz et al. | |
| 2006/0002021 A1 | 1/2006 | Li et al. | |
| 2006/0051698 A1 | 3/2006 | Miyoshi et al. | |

(Continued)

FOREIGN PATENT DOCUMENTS

| | | |
|---|---|---|
| JP | 60-074133 | 4/1985 |
| JP | 61-137240 | 6/1986 |

(Continued)

OTHER PUBLICATIONS

Machine translation of JP 09-302053 (no date).*

(Continued)

*Primary Examiner* — Amanda C. Walke
(74) *Attorney, Agent, or Firm* — Knobbe, Martens, Olson & Bear, LLP

(57) ABSTRACT

According to one embodiment, an ultraviolet-curing resin material for pattern transfer contains at least one of 2-methyl-2-adamantyl acrylate, 2-ethyl-2-adamantyl acrylate, and 1,3-adamantanedimethanol diacrylate, isobornyl acrylate, polyfunctional acrylate, and a polymerization initiator, or contains at least one of the acrylates described above, a polymerization initiator, and fluorine-based alcohol.

4 Claims, 4 Drawing Sheets

U.S. PATENT DOCUMENTS

| | | | |
|---|---|---|---|
| 2006/0145373 A1 | 7/2006 | Kiyono et al. | |
| 2006/0263723 A1 | 11/2006 | Kozawa et al. | |
| 2006/0279025 A1 | 12/2006 | Heidari et al. | |
| 2007/0160937 A1 | 7/2007 | Ogino et al. | |
| 2007/0212522 A1 | 9/2007 | Heidari et al. | |
| 2008/0029931 A1 | 2/2008 | Tada et al. | |
| 2008/0152933 A1* | 6/2008 | Mizuno et al. | 428/480 |
| 2008/0213420 A1 | 9/2008 | Sugimura et al. | |
| 2008/0237938 A1 | 10/2008 | Fukuzawa et al. | |
| 2009/0030107 A1* | 1/2009 | Watanabe et al. | 522/171 |
| 2009/0104395 A1 | 4/2009 | Bruder et al. | |
| 2010/0159281 A1 | 6/2010 | Morita | |
| 2010/0230383 A1 | 9/2010 | Umezawa | |
| 2010/0233514 A1 | 9/2010 | Umezawa | |
| 2010/0237041 A1* | 9/2010 | Morita et al. | 216/22 |

FOREIGN PATENT DOCUMENTS

| | | | |
|---|---|---|---|
| JP | 63-149116 A | | 6/1988 |
| JP | 63-159090 | | 7/1988 |
| JP | H01-248335 | | 10/1989 |
| JP | 03-59831 | | 3/1991 |
| JP | H03-069321 | | 3/1991 |
| JP | H04-059385 | | 2/1992 |
| JP | H04-337307 | | 11/1992 |
| JP | H04-372741 | | 12/1992 |
| JP | H05-266472 | | 10/1993 |
| JP | H06-158019 | | 6/1994 |
| JP | H06-248251 | | 9/1994 |
| JP | 09194547 A | * | 7/1997 |
| JP | H09-204697 | | 8/1997 |
| JP | 09302053 A | * | 11/1997 |
| JP | 2000-149329 | | 5/2000 |
| JP | 2000-348390 | | 12/2000 |
| JP | 2001-343748 | | 12/2001 |
| JP | 2001-344734 | | 12/2001 |
| JP | 2004-103070 | | 4/2004 |
| JP | 2004-110896 | | 4/2004 |
| JP | 2005-122829 | | 5/2005 |
| JP | 2005-166241 | | 6/2005 |
| JP | 2007-055235 | | 3/2007 |
| JP | 2007-131754 | | 5/2007 |
| JP | 2007-141370 | | 6/2007 |
| JP | 2007-178724 | | 7/2007 |
| JP | 2007-186570 | | 7/2007 |
| JP | 2007-194304 | | 8/2007 |
| JP | 2008-012859 | | 1/2008 |
| JP | 2008-019292 | | 1/2008 |
| JP | 2008-192250 | | 8/2008 |
| JP | 2008-251130 | | 10/2008 |
| JP | 2008-274244 | | 11/2008 |
| JP | 2010-159369 A | | 7/2010 |

OTHER PUBLICATIONS

Machine translation of JP 09-194547 (no date).*
Machine translation of JP 2008-019292 (no date).*
Information Sheet in one page.
Notification of Reasons of Rejection mailed by Japan Patent Office on Mar. 19, 2011 in the corresponding Japanese patent application No. 2010-265030 in 7 pages.
Notification of Reasons of Rejection mailed by Japan Patent Office on Jan. 11, 2011 in the corresponding Japanese patent application No. 2009-066643 in 4 pages.
Notification of Decision of Rejection mailed by Japan Patent Office on Aug. 31, 2010 in the corresponding Japanese patent application No. 2009-066643 in 4 pages.
Notification of Reasons of Rejection mailed by Japan Patent Office on May 25, 2010 in the corresponding Japanese patent application No. 2009-066643 in 6 pages.
Notice of Reasons for Rejection mailed by the Japan Patent Office on Aug. 31, 2010 in Japanese Patent app. No. 2009-060932 in 4 pages.
Japanese Office Action mailed Apr. 10, 2012, in corresponding Japanese Pat. App. No. 2010-207045, 4 pages.

* cited by examiner

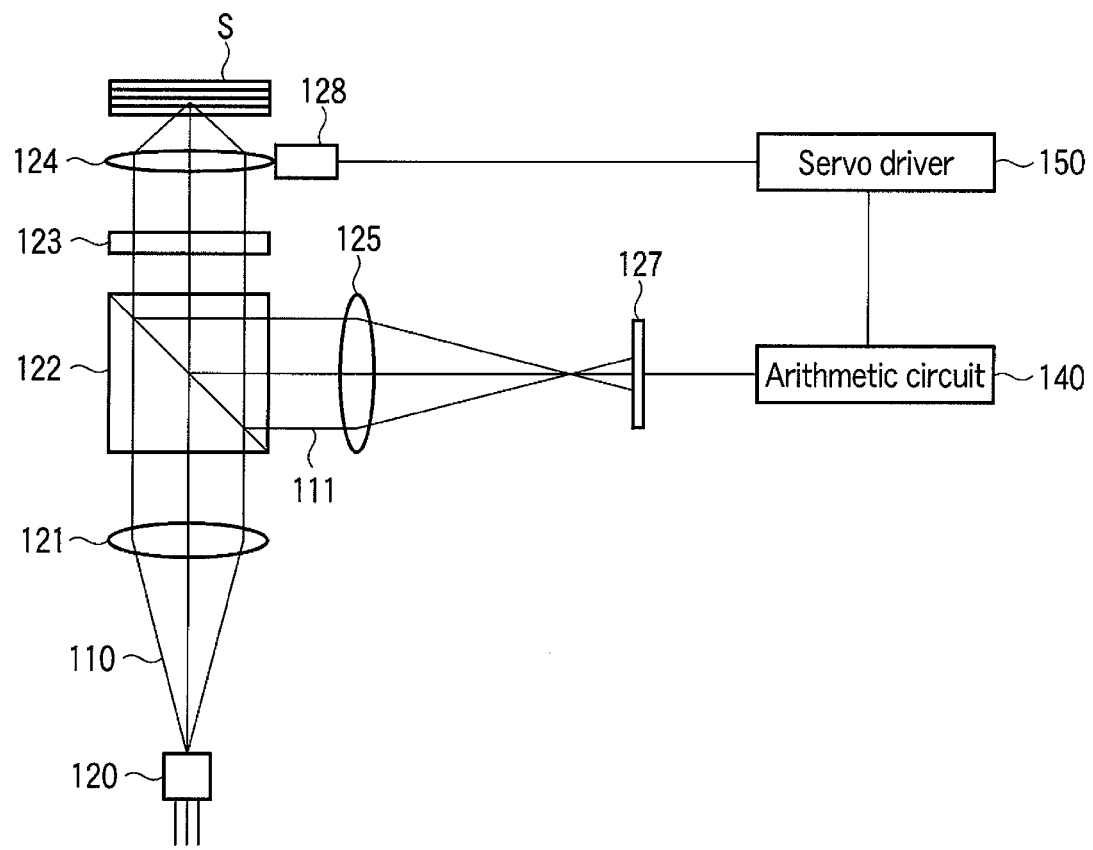
F I G. 4

ULTRAVIOLET-CURING RESIN MATERIAL FOR PATTERN TRANSFER AND MAGNETIC RECORDING MEDIUM MANUFACTURING METHOD USING THE SAME

CROSS-REFERENCE TO RELATED APPLICATIONS

This application is based upon and claims the benefit of priority from Japanese Patent Application No. 2009-062008, filed Mar. 13, 2009, the entire contents of which are incorporated herein by reference.

BACKGROUND

1. Field

One embodiment of the present invention relates to a method of manufacturing a magnetic recording medium having discrete tracks on the surface of a magnetic recording layer and, more particularly, to an ultraviolet-curing resin material to be used as a resist when transferring a discrete track shape.

2. Description of the Related Art

Recently, the nano-imprinting techniques are attracting attention in various fields in order to further increase the density and accuracy.

For example, applications to semiconductors, optical elements, magnetic recording media, and the like are being examined.

As a magnetic recording medium, a discrete track medium is attracting attention. In this discrete track medium, magnetic interference between adjacent recording tracks is reduced by separating the adjacent tracks by grooves or guard bands made of a nonmagnetic material in order to further increase the density.

When manufacturing this discrete track medium, discrete track patterns of a magnetic layer can be formed by applying the nano-imprinting technique by using a stamper. When magnetic layer patterns corresponding to servo area signals are formed together with recording track patterns by imprinting, it is possible to obviate the servo track writing step required in the manufacture of the conventional magnetic recording media. This leads to a cost reduction.

As the process of forming discrete track patterns as described above, it is possible to use a process of transferring resist patterns from, e.g., an Ni stamper by high-pressure imprinting or thermal imprinting as described in, e.g., Jpn. Pat. Appln. KOKAI Publication No. 2007-186570. Unfortunately, this process is unsuitable for mass-production because the life of the Ni stamper is short. Also, when the data density is increased to make tracks finer, resist patterns cannot be successfully transferred.

From the foregoing, the use of optical nano-imprinting is attracting attention as another nano-imprinting technique.

To transfer patterns onto a resist on a discrete track medium by using optical nano-imprinting, a resin stamper is first duplicated from an Ni stamper (mother stamper) by injection molding, and bonded in a vacuum to an uncured ultraviolet-curing resin layer to be used as a resist. This method is found to be able to reduce the cost and is suitable for micropatterning.

The characteristics required of the ultraviolet-curing resin to be transferred onto the above-mentioned discrete track medium can be given by the resistance against etching for processing transferred patterns in addition to the property of coating onto the medium, the viscosity, the hardness, the property of separation from the resin stamper, and the cure shrinkage.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 4 is a view showing an outline of the arrangement of a transfer pattern sample evaluation apparatus.

DETAILED DESCRIPTION

Figure 1A:
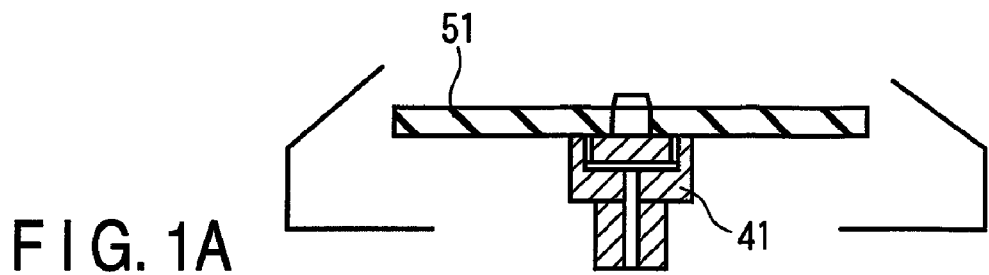
FIGS. 1A, 1B, 1C and 1D are views showing a pattern transfer method to be used in the present invention.

Various embodiments according to the invention will be described hereinafter with reference to the accompanying drawings. In general, according to one embodiment of the invention, an ultraviolet-curing resin material for pattern transfer is provided, which contains isobornyl acrylate represented by formula (1) below, polyfunctional acrylate, adamantyl acrylate, and a polymerization initiator.

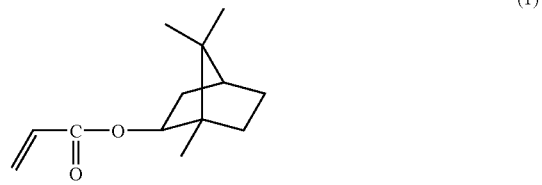

(1)

The adamantyl acrylate is at least one acrylate selected from the group consisting of 2-methyl-2-adamantyl acrylate represented by formula (2) below, 2-ethyl-2-adamantyl acrylate represented by formula (3) below, and 1,3-adamantanedimethanol diacrylate represented by formula (4) below.

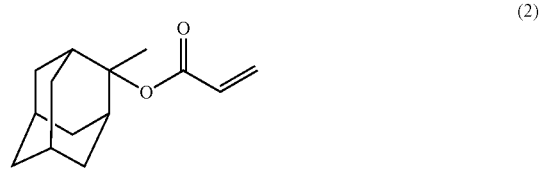 [SMILES: C=CC(=O)OC1(C)C2CC3CC(C2)CC1C3]

(2)

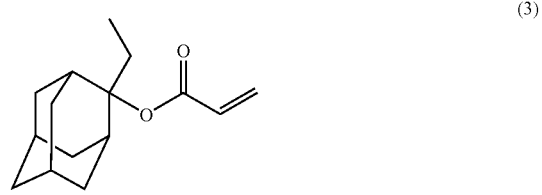 [SMILES: C=CC(=O)OC1(CC)C2CC3CC(C2)CC1C3]

(3)

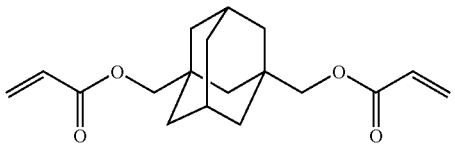

(4)

The present invention can increase the etching resistance without deteriorating the ultraviolet curing property and the property of separation after curing, by using an ultraviolet-curing resin material for pattern transfer containing isobornyl acrylate, polyfunctional acrylate, predetermined adamantyl acrylate, and a polymerization initiator. When using this ultraviolet-curing resin material for pattern transfer, patterns can accurately be transferred from a stamper.

Isobornyl acrylate has a relatively low viscosity of 9 CP and a relatively high glass transition point Tg. Also, isobornyl acrylate has a high etching resistance because it has an alicyclic structure. When a material containing two components, i.e., this isobornyl acrylate and a polymerization initiator was used as the ultraviolet-curing resin material for pattern transfer, the hardness of the cured film was insufficient. This similarly happened when a monofunctional monomer, a bifunctional monomer, and isobornyl acrylate were combined. When a trifunctional monomer was combined, the hardness of the cured film was sufficient while the etching resistance remained high. The viscosity often increases when using a polyfunctional monomer larger than a trifunctional monomer.

Also, isobornyl acrylate has an alicyclic structure, and has a high etching resistance because the glass transition temperature Tg is high. However, the property of separation from a resin stamper is difficult to improve because the hardness after curing is high, i.e., the film readily becomes hard, the surface tension is low, and the like.

A magnetic recording medium manufacturing method of the present invention includes bonding, in a vacuum, the surface of a magnetic recording layer of a magnetic recording medium including a data area and servo area, and a three-dimensional pattern surface of a resin stamper, with a coating layer of an uncured ultraviolet-curing resin material for pattern transfer being interposed between them, curing the coating layer of the uncured ultraviolet-curing resin material by irradiating the coating layer with ultraviolet rays, separating the resin stamper to form, on one surface of the magnetic recording medium, a cured ultraviolet-curing resin material layer onto which a three-dimensional pattern is transferred, and performing dry etching by using the cured ultraviolet-curing resin material layer as a mask, thereby forming a three-dimensional pattern on the surface of the magnetic recording layer, wherein the ultraviolet-curing resin material for pattern transfer contains isobornyl acrylate, polyfunctional acrylate, predetermined adamantyl acrylate, and a polymerization initiator.

In addition to the acrylates and polymerization initiator described above, an additive such as an adhesive can be mixed at a ratio of 1 wt % or less in the ultraviolet-curing resin material for pattern transfer of the present invention.

The ultraviolet-curing resin material for pattern transfer of the present invention can have a viscosity of 9 to 15 cp at 25° C.

If an ultraviolet-curing resin material made of a monomer, oligomer, and polymerization initiator and containing no solvent is used, the etching rate of Ar milling during dry etching processing increases, and the groove width increases after the dry etching processing. This often makes it difficult to form fine grooves.

Also, an oligomer having a large molecular weight is presumably the cause of decreasing the dry etching resistance.

As the ultraviolet-curing resin material according to the first embodiment of the present invention, therefore, the use of an ultraviolet-curing resin material made of a plurality of predetermined types of monomers and a polymerization initiator and containing neither an oligomer nor a solvent has been examined.

Furthermore, the ultraviolet-curing resin material of the present invention is a radical polymerization-based material, and acrylate is used as a monomer in the present invention because the speed of a photopolymerization reaction is low if the monomer is methacrylate.

The content of isobornyl acrylate can be 70 (inclusive) to 95 (inclusive) wt %, that of the polyfunctional acrylate can be 1 (inclusive) to 30 (inclusive) wt %, that of the adamantyl acrylate can be 1 (inclusive) to 30 (inclusive) wt %, and that of the polymerization initiator can be 0.5 (inclusive) to 6 (inclusive) wt %. When using the ultraviolet-curing resin material having the above contents, the viscosity, the property of separation, the curing property, the film thickness of a coating film, and the etching rate further improve.

The polyfunctional acrylates to be used in the present invention include bifunctional acrylate, trifunctional acrylate, and tetrafunctional and higher-order-functional acrylates.

Examples of the bifunctional acrylate are
1,3-butylene glycol diacrylate,
1,4-butanediol diacrylate,
diethylene glycol diacrylate,
1,6-hexanediol diacrylate,
neopentyl glycol diacrylate,
polyethylene glycol (200) diacrylate,
tetraethylene glycol diacrylate,
triethylene glycol diacrylate,
tripropylene glycol diacrylate,
polyethylene glycol (400) diacrylate,
ethoxylated (3) bisphenol A diacrylate,
cyclohexane dimethanol diacrylate,
dipropylene glycol diacrylate,
acrylate ester (dioxane glycol diacrylate),
alkoxylated hexanediol diacrylate,
alkoxylated cyclohexanedimethanol diacrylate,
ethoxylated (4) bisphenol A diacrylate,
ethoxylated (10) bisphenol A diacrylate,
polyethylene glycol (600) diacrylate,
tricyclodecanedimethanol diacrylate,
propoxylated (2) neopentyl glycol diacrylate,
ethoxylated (30) bisphenol A diacrylate, and
alkoxylated neopentyl glycol diacrylate.

As the trifunctional acrylate, it is possible to use, e.g.,
trimethylolpropane triacrylate,
trimethylolpropane PO-modified triacrylate
(the number of POs (propoxy groups): 2, 3, 4, 6),
trimethylolpropane EO-modified triacrylate
(the number of EOs (ethoxy groups): 3, 6, 9, 15, 20),
tris(2-hydroxyethyl)isocyanurate triacrylate,
pentaerythritol triacrylate,
pentaerythritol EO-modified triacrylate,
EO-modified glycerin triacrylate,
propoxylated (3) glyceryl triacrylate, highly propoxylated (5.5) glyceryl triacrylate,
trisacryloyloxyethyl phosphate, and
ε-caprolactone-modified tris(acryloxyethyl)isocyanurate.

As the tetrafunctional and higher-order-function acrylates, it is possible to use, e.g.,
trisacryloyloxyethyl phosphate,
pentaerythritol tetraacrylate,
ditrimethylolpropane tetraacrylate,
ethoxylated (4) pentaerythritol tetraacrylate, and
dipentaerythritol pentaacrylate.

Examples of the polymerization initiator to be used in the present invention are an alkylphenone-based photopolymerization initiator, acylphosphine oxide-based polymerization initiator, titanocene-based polymerization initiator, oxime ester-based photopolymerization initiator, and oxime ester acetate-based photopolymerization initiator.

Practical examples of the above-mentioned polymerization initiators are
2,2-dimethoxy-1,2-diphenylethane-1-on (IRGACURE 651 manufactured by Ciba Specialty Chemicals),
1-hydroxy-cyclohexyl-phenyl-ketone (IRGACURE 184 manufactured by Ciba Specialty Chemicals), and
2-hydroxy-2-methyl-1-phenyl-propane-1-on (DAROCUR 1173 manufactured by Ciba Specialty Chemicals).

Other examples are IRGACURE 2959, IRGACURE 127, IRGACURE 907, IRGACURE 369, IRGACURE 379, DAROCUR TPO, IRGACURE 819, IRGACURE 784, IRGACURE OXE01, IRGACURE OXE02, and IRGACURE 754 (all are manufactured by Ciba Specialty Chemicals).

It is possible to select an optimal polymerization initiator in accordance with the wavelength of a lamp for use in UV irradiation.

As the lamp for use in UV irradiation, it is possible to use, e.g., a high-pressure mercury lamp, metal halide lamp, or xenon flash lamp.

An acrylate having an adamantyl group, i.e., so-called adamantyl acrylate has an alicyclic structure and hence has a high etching resistance. In addition, adamantyl acrylate has a Tg higher than that of isobornyl acrylate and is superior to isobornyl acrylate in heat resistance. Many adamantyl acrylates normally solidify at room temperature and hence cannot be used as a component of the ultraviolet-curing resin material. However, the following three types of adamantyl acrylates are liquids at room temperature, have a viscosity of 100 to 140 CP, and hence can be used as the ultraviolet-curing resin material of the present invention.
2-methyl-2-adamantyl acrylate
2-ethyl-2-adamantyl acrylate
1,3-adamantanedimethanol diacrylate An ultraviolet-curing resin material according to the second embodiment of the present invention is prepared by dissolving an ultraviolet-curing resin in an organic solvent, and contains at least one acrylate selected from the group consisting of adamantyl acrylate, isobornyl acrylate, and polyfunctional acrylate, a polymerization initiator, and fluorine-based alcohol. This adamantyl acrylate is at least one acrylate selected from the group consisting of 2-methyl-2-adamantyl acrylate, 2-ethyl-2-adamantyl acrylate, and 1,3-adamantanedimethanol diacrylate.

When the ultraviolet-curing resin is dissolved in an organic solvent, it is readily possible to decrease the viscosity, and the solvent volatilizes during spin coating. This facilitates controlling the film thickness in accordance with the spin conditions, and increases the uniformity of the film thickness from the inner periphery to the outer periphery.

An outline of a pattern transfer method to be used in the present invention will be explained below with reference to FIGS. 1A to 1D.

Figure 1B:
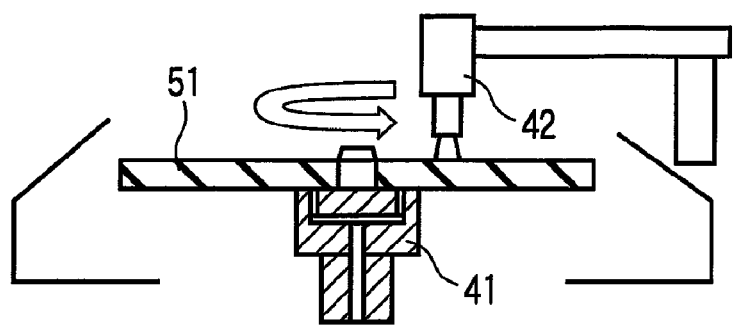
Figure 1C:
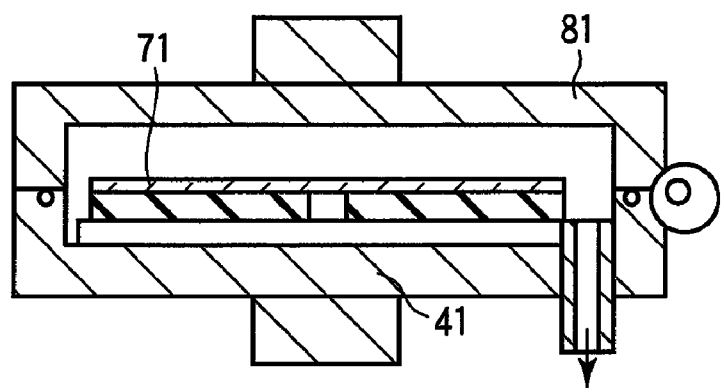
Figure 1D:
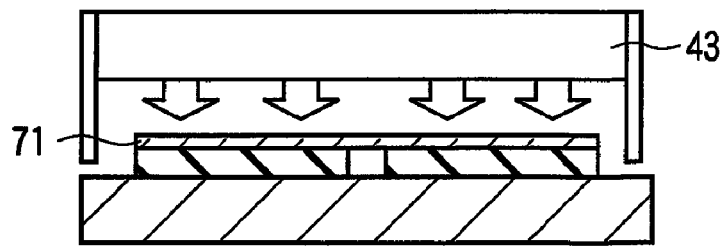

FIGS. 1A to 1D illustrate the transfer of patterns onto one surface of a medium substrate. As shown in FIG. 1A, a medium substrate 51 is set on a spinner 41. As shown in FIG. 1B, while the medium substrate 51 is spun together with the spinner 41, an ultraviolet-curing resin (2P resin) is dropped from a dispenser 42 and spin-coated. As shown in FIG. 1C, in a vacuum chamber 81, one surface of the magnetic recording medium 51 and a pattern surface of a transparent stamper 71 are bonded in a vacuum with a 2P resin layer (not shown) being interposed between them. As shown in FIG. 1D, the 2P resin layer is cured by emitting UV radiation from a UV light source 43 through the transparent stamper 71 at atmospheric pressure. After the step shown in FIG. 1D, the transparent stamper 71 is separated.

Examples of a magnetic disk substrate usable in the present invention are a glass substrate, an Al-based alloy substrate, a ceramic substrate, a carbon substrate, an Si single-crystal substrate having an oxidized surface, and a substrate obtained by forming an NiP layer on the surface of any of these substrates. As the glass substrate, amorphous glass or crystallized glass can be used. Examples of the amorphous glass are soda lime glass and alumino silicate glass. An example of the crystallized glass is a lithium-based crystallized glass. As the ceramic substrate, it is possible to use a sintered product mainly containing aluminum oxide, aluminum nitride, or silicon nitride, or a material formed by fiber-reinforcing the sintered product. Plating or sputtering is used to form the NiP layer on the substrate surface.

When manufacturing a perpendicular magnetic recording medium, a so-called perpendicular double-layered medium can be formed by forming a perpendicular magnetic recording layer on a soft magnetic underlayer (SUL) on a substrate. The soft magnetic underlayer of the perpendicular double-layered medium passes a recording magnetic field from a recording magnetic pole, and returns the recording magnetic field to a return yoke placed near the recording magnetic pole. That is, the soft magnetic underlayer performs a part of the function of a recording head; the soft magnetic underlayer applies a steep perpendicular magnetic field to the recording layer, thereby increasing the recording efficiency.

An example of the soft magnetic underlayer usable in the present invention is a high-k material containing at least one of Fe, Ni, and Co. Examples of the material are FeCo-based alloys such as FeCo and FeCoV, FeNi-based alloys such as FeNi, FeNiMo, FeNiCr, and FeNiSi, FeAl-based and FeSi-based alloys such as FeAl, FeAlSi, FeAlSiCr, FeAlSiTiRu, and FeAlO, FeTa-based alloys such as FeTa, FeTaC, and FeTaN, and FeZr-based alloys such as FeZrN.

As the soft magnetic underlayer, it is also possible to use a material having a microcrystal structure such as FeAlO, FeMgO, FeTaN, or FeZrN containing 60 at % or more of Fe, or a material having a granular structure in which fine crystal grains are dispersed in a matrix.

As another material of the soft magnetic underlayer, it is possible to use a Co alloy containing Co and at least one of Zr, Hf, Nb, Ta, Ti, and Y. The content of Co can be 80 at % or more. An amorphous layer is readily formed when a film of the Co alloy is formed by sputtering. The amorphous soft magnetic material has none of magnetocrystalline anisotropy, a crystal defect, and a grain boundary, and hence has superb soft magnetism. It is also possible to reduce the noise of the medium by using the amorphous soft magnetic material. Favorable examples of the amorphous soft magnetic material are CoZr-based, CoZrNb-based, and CoZrTa-based alloys.

Another underlayer may also be formed below the soft magnetic underlayer in order to improve the crystallinity of the soft magnetic underlayer or improve the adhesion to the substrate. As the underlayer material, it is possible to use Ti, Ta, W, Cr, Pt, an alloy containing any of these materials, or an oxide or nitride of any of these materials.

An interlayer made of a nonmagnetic material can be formed between the soft magnetic underlayer and perpendicular magnetic recording layer. The interlayer interrupts the exchange coupling interaction between the soft magnetic underlayer and recording layer, and controls the crystallinity of the recording layer. As the interlayer material, it is possible to use Ru, Pt, Pd, W, Ti, Ta, Cr, Si, an alloy containing any of these materials, or an oxide or nitride of any of these materials.

To prevent spike noise, it is possible to divide the soft magnetic underlayer into a plurality of layers, and antiferromagnetically couple these layers with 0.5- to 1.5-nm thick Ru films sandwiched between them. Also, the soft magnetic layer can be coupled by exchange coupling with a hard magnetic film having in-plane anisotropy such as CoCrPt, SmCo, or FePt, or a pinning layer made of an antiferromagnetic material such as IrMn or PtMn. To control the exchange coupling force, a magnetic layer such as a Co layer or a nonmagnetic layer such as a Pt layer can be stacked above and below the Ru layer.

As the perpendicular magnetic recording layer usable in the present invention, it is possible to use a material mainly containing Co, containing at least Pt, containing Cr as needed, and further containing an oxide (e.g., silicon oxide or titanium oxide). In this perpendicular magnetic recording layer, the magnetic crystal grains can form a pillar structure. In the perpendicular magnetic recording layer having this structure, the orientation and crystallinity of the magnetic crystal grains are favorable. As a consequence, a signal/noise ratio (S/N ratio) suitable for high-density recording can be obtained. The amount of oxide is important to obtain the above structure. The content of the oxide can be 3 (inclusive) to 12 (inclusive) mol %, and can also be 5 (inclusive) to 10 (inclusive) mol %, with respect to the total amount of Co, Pt, and Cr. When the content of the oxide in the perpendicular magnetic recording layer falls within the above range, the oxide deposits around the magnetic grains, so the magnetic grains can be isolated and downsized. If the content of the oxide exceeds the above range, the oxide remains in the magnetic grains and deteriorates the orientation and crystallinity of the magnetic grains. Furthermore, the oxide deposits above and below the magnetic grains. Consequently, the pillar structure in which the magnetic grains vertically extend through the perpendicular magnetic recording layer is often not formed. On the other hand, if the content of the oxide is less than the above range, the magnetic grains are insufficiently isolated and downsized. As a result, noise increases in recording and reproduction, and this often makes it impossible to obtain a signal/noise ratio (S/N ratio) suited to high-density recording.

The content of Pt in the perpendicular magnetic recording layer can be 10 (inclusive) to 25 (inclusive) at %. When the Pt content falls within the above range, a uniaxial magnetic anisotropy constant Ku necessary for the perpendicular magnetic recording layer is obtained. In addition, the crystallinity and orientation of the magnetic grains improve. Consequently, a thermal decay characteristic and recording/reproduction characteristic suited to high-density recording are obtained. If the Pt content exceeds the above range, a layer having the fcc structure is formed in the magnetic grains, and the crystallinity and orientation may deteriorate. On the other hand, if the Pt content is less than the above range, it is often impossible to obtain Ku, i.e., a thermal decay characteristic suitable for high-density recording.

The content of Cr in the perpendicular magnetic recording layer can be 0 (inclusive) to 16 (inclusive) at %, and can also be 10 (inclusive) to 14 (inclusive) at %. When the Cr content falls within the above range, it is possible to maintain high magnetization without decreasing the uniaxial magnetic anisotropy constant Ku of the magnetic grains. Consequently, a recording/reproduction characteristic suited to high-density recording and a sufficient thermal decay characteristic are obtained. If the Cr content exceeds the above range, the thermal decay characteristic worsens because Ku of the magnetic grains decreases. In addition, the crystallinity and orientation of the magnetic grains worsen. As a consequence, the recording/reproduction characteristic tends to worsen.

The perpendicular magnetic recording layer can contain one or more additive elements selected from B, Ta, Mo, Cu, Nd, W, Nb, Sm, Tb, Ru, and Re, in addition to Co, Pt, Cr, and the oxide. These additive elements can promote the downsizing of the magnetic grains, or improve the crystallinity and orientation of the magnetic grains. This makes it possible to obtain a recording/reproduction characteristic and thermal decay characteristic more suitable for high-density recording. The total content of these additive elements can be 8 at % or less. If the total content exceeds 8 at %, a phase other than the hcp phase is formed in the magnetic grains, and this disturbs the crystallinity and orientation of the magnetic grains. As a result, it is often impossible to obtain a recording/reproduction characteristic and thermal decay characteristic suited to high-density recording.

Other examples of the material of the perpendicular magnetic recording layer are a CoPt-based alloy, a CoCr-based alloy, a CoPtCr-based alloy, CoPtO, CoPtCrO, CoPtSi, and CoPtCrSi. As the perpendicular magnetic recording layer, it is also possible to use a multilayered film containing Co and an alloy mainly containing at least one element selected from the group consisting of Pt, Pd, Rh, and Ru. It is further possible to use a multilayered film such as CoCr/PtCr, CoB/PdB, or CoO/RhO obtained by adding Cr, B, or O to each layer of the former multilayered film.

The thickness of the perpendicular magnetic recording layer can be 5 to 60 nm, and can also be 10 to 40 nm. A perpendicular magnetic recording layer having a thickness falling within this range is suited to a high recording density. If the thickness of the perpendicular magnetic recording layer is less than 5 nm, the reproduction output becomes too low, so the noise component often becomes higher than the reproduction output. On the other hand, if the thickness of the perpendicular magnetic recording layer exceeds 40 nm, the reproduction output becomes too high and tends to distort the waveform. The coercive force of the perpendicular magnetic recording layer can be 237,000 A/m (3,000 Oe) or more. If the coercive force is less than 237,000 A/m (3,000 Oe), the thermal decay resistance tends to decrease. The perpendicular squareness ratio of the perpendicular magnetic recording layer can be 0.8 or more. If the perpendicular squareness ratio is less than 0.8, the thermal decay resistance often decreases.

A protective layer can be formed on the perpendicular magnetic recording layer.

The protective layer prevents the corrosion of the perpendicular magnetic recording layer, and also prevents damage to the medium surface when a magnetic head comes in contact with the medium. Examples of the material of the protective layer are materials containing C, $SiO_2$, and $ZrO_2$. The thickness of the protective layer can be 1 to 10 nm. When the thickness of the protective layer falls within the above range, the distance between the head and medium can be decreased. This is suitable for high-density recording.

The surface of the perpendicular magnetic recording medium can be coated with a lubricant, e.g., perfluoropolyether, fluorinated alcohol, or fluorinated carboxylic acid.

Figure 2:
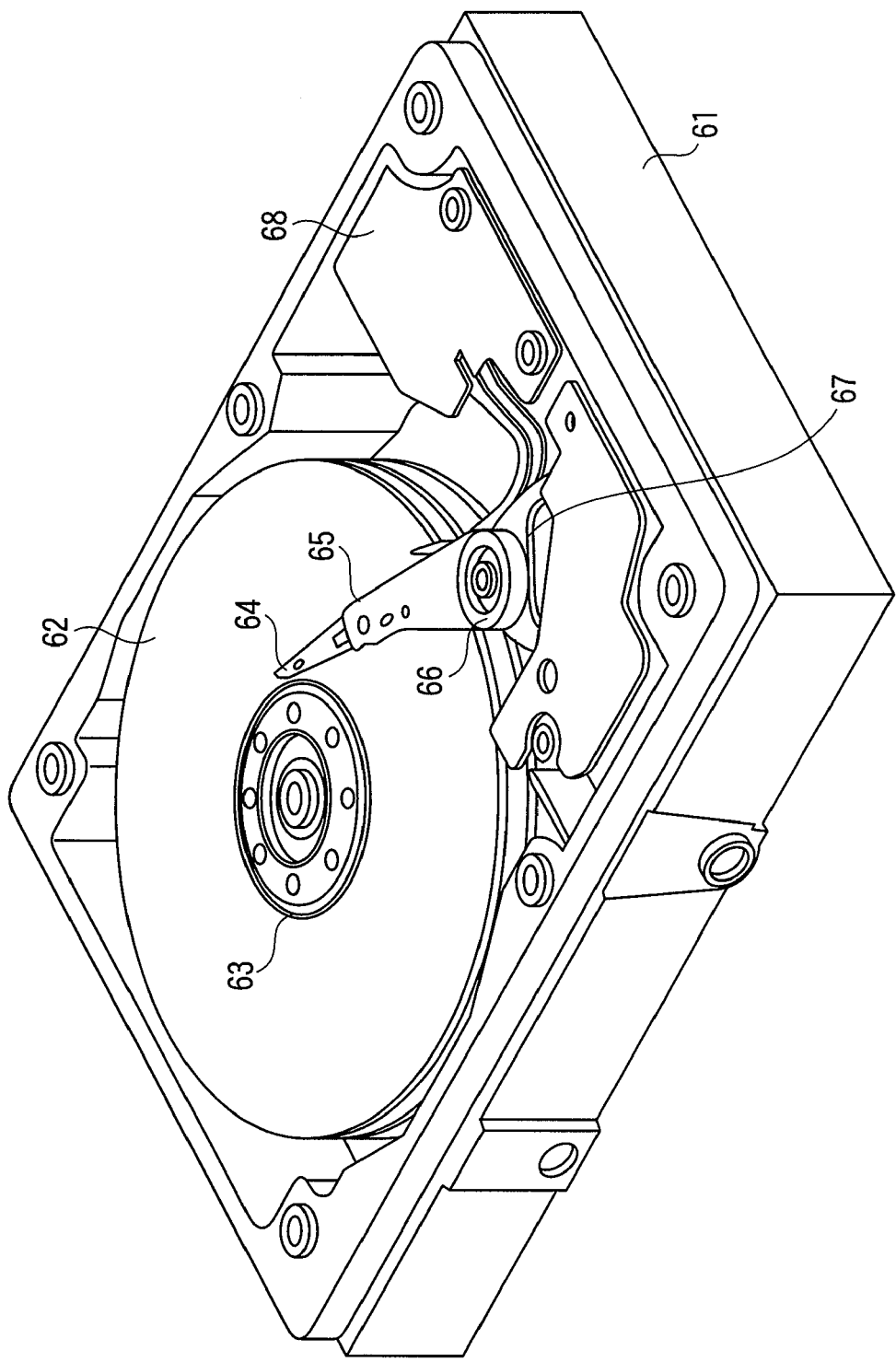
FIG. 2 is a view showing a magnetic recording/reproduction apparatus for performing recording and reproduction on a magnetic recording medium.

FIG. 2 is a view showing a magnetic recording/reproduction apparatus for performing recording and reproduction on the magnetic recording medium.

This magnetic recording apparatus includes, in a housing 61, a magnetic recording medium 62, a spindle motor 63 for rotating the magnetic recording medium 62, a head slider 64 including a recording/reproduction head, a head suspension assembly (a suspension 65 and actuator arm 66) for supporting the head slider 64, a voice coil motor 67, and a circuit board.

The magnetic recording medium 62 is attached to and rotated by the spindle motor 63, and various digital data are recorded by the perpendicular magnetic recording method. The magnetic head incorporated into the head slider 64 is a so-called composite head, and includes a write head having a single-pole structure and a read head using a GMR film or TMR film. The suspension 65 is held at one end of the actuator arm 66, and supports the head slider 64 so as to oppose it to the recording surface of the magnetic recording medium 62. The actuator arm 66 is attached to a pivot 68. The voice coil motor 67 is formed as an actuator at the other end of the actuator arm 64. The voice coil motor 67 drives the head suspension assembly to position the magnetic head in an arbitrary radial position of the magnetic recording medium 62. The circuit board includes a head IC, and generates, e.g., a voice coil motor driving signal, and control signals for controlling read and write performed by the magnetic head.

An address signal and the like can be reproduced from the processed magnetic recording medium by using this magnetic disk apparatus.

A magnetic disk in which the track density was 325 kTPI (Track Per Inch, equivalent to a track pitch of 78 nm) in a data zone having a radius of 9 to 22 mm was manufactured by using the method of the present invention.

To manufacture the magnetic disk having this servo area, imprinting is performed using a stamper having three-dimensional patterns corresponding to magnetic layer patterns on the magnetic disk. Note that the surface of the three-dimensional patterns of the magnetic layer formed by imprinting and subsequent processing may also be planarized by burying a nonmagnetic material in recesses.

A method of manufacturing the magnetic disk of this embodiment will be explained below.

First, a stamper was manufactured.

An Si wafer having a diameter of 6 inches was prepared as a substrate of a master as a template of the stamper. On the other hand, resist ZEP-520A available from ZEON was diluted to ½ with anisole, and the solution was filtered through a 0.05-μm filter. The Si wafer was spin-coated with the resist solution and prebaked at 200° C. for 3 min, thereby forming a resist layer about 50 nm thick.

An electron beam lithography system having a ZrO/W thermal field emission type electron gun emitter was used to directly write desired patterns on the resist onto the Si wafer at an acceleration voltage of 50 kV. This lithography was performed using a signal source that synchronously generates signals for forming servo patterns, burst patterns, address patterns, and track patterns, signals to be supplied to a stage driving system (a so-called X-θ stage driving system including a moving mechanism having a moving axis in at least one direction and a rotating mechanism) of the lithography system, and an electron beam deflection control signal. During the lithography, the stage was rotated at a CLV (Constant Linear Velocity) of 500 mm/s, and moved in the radial direction as well. Also, concentric track areas were written by deflecting the electron beam for every rotation. Note that the feeding speed was 7.8 nm per rotation, and one track (equivalent to one address bit width) was formed by ten rotations.

The resist was developed by dipping the Si wafer in ZED-N50 (available from ZEON) for 90 sec. After that, the Si wafer was rinsed as it was dipped in ZMD-B (available from ZEON) for 90 sec, and dried by air blow. In this way, a resist master (not shown) was manufactured.

A conductive film made of Ni was formed on the resist master by sputtering. More specifically, pure nickel was used as a target. After a chamber was evacuated to $8 \times 10^{-3}$ Pa, the pressure was adjusted to 1 Pa by supplying argon gas, and sputtering was performed in the chamber for 40 sec by applying a DC power of 400 W, thereby forming a conductive film about 10 nm thick.

The resist master having this conductive film was dipped in a nickel sulfamate plating solution (NS-160 available from Showa Chemical Industry), and Ni electroforming was performed for 90 min, thereby forming an electroformed film about 300 μm thick. The electroforming bath conditions were as follows.

Electroforming Bath Conditions
Nickel sulfamate: 600 g/L
Boric acid: 40 g/L
Surfactant (sodium lauryl sulfate): 0.15 g/L
Solution temperature: 55° C.
pH: 4.0
Current density: 20 A/dm$^2$ The electroformed film and conductive film were separated together with the resist residue from the resist master. The resist residue was removed by oxygen plasma ashing. More specifically, plasma ashing was performed for 20 min by applying a power of 100 W in a chamber in which the pressure was adjusted to 4 Pa by supplying oxygen gas at 100 mL/min.

Figure 3A:
FIGS. 3A, 3B, 3C, 3D, 3E, 3F, 3G, 3H, 3I, 3J and 3K are views showing an example of a discrete magnetic recording medium manufacturing method.
Figure 3B:

As shown in FIG. 3A, a father stamper 1 including the conductive film and electroformed film as described above was obtained. After that, electroforming was further performed to duplicate a mother stamper 2 as shown in FIG. 3B. An injection molding stamper was obtained by removing unnecessary portions of the mother stamper 2 by a metal blade.

Figure 3C:
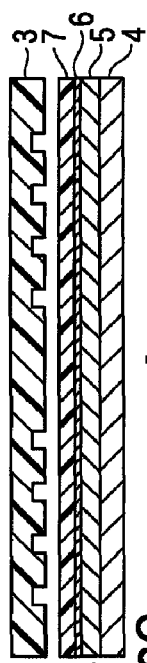

As shown in FIG. 3C, a resin stamper 3 was duplicated from the mother stamper 2 by using an injection molding apparatus manufactured by TOSHIBA MACHINE. As the molding material, cyclic olefin polymer ZEONOR 1060R available from ZEON was used. However, polycarbonate material AD5503 available from TEIJIN CHEMICALS may also be used.

Then, a magnetic disk was manufactured.

Figure 3D:
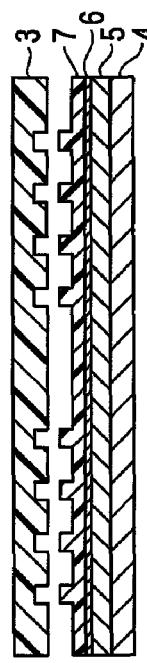
Figure 3E:
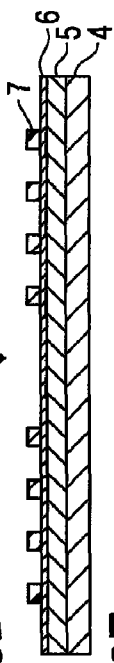
Figure 3F:
Figure 3G:
Figure 3H:

A magnetic recording layer was formed by sputtering on a disk substrate made of doughnut-like glass 1.8 inches in diameter shown in FIG. 3G. A 3-nm thick metal mask layer was stacked on this magnetic recording layer. Examples of a metal usable as the metal mask layer are Ag, Al, Au, C, Cr, Cu, Ni, Pt, Pd, Ru, Si, Ta, Ti, Zn, and alloys (e.g., CrTi, CoB, CoPt, CoZrNb, NiTa, NiW, Cr—N, SiC, and TiO$_x$) containing these metals. Among these metals, Si and Cu are superior in property of separation from a resin stamper and processability. The film thickness of the metal mask layer is determined by the processability, and may be as small as possible. In this embodiment, a 3-nm thick Cu layer was stacked on the magnetic recording layer.

Figure 3I:
Figure 3J:
Figure 3K:
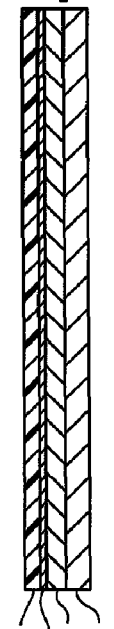

After a surface protection layer 6 was formed on a magnetic recording layer 5 as shown in FIG. 3I, a resist 7 made of an ultraviolet-curing resin material was formed by spin coating at a rotational speed of 10,000 rpm.

As shown in FIG. 3C, the resin stamper 3 was bonded to the ultraviolet-curing resin resist 7 on the surface of the disk substrate by vacuum bonding, and the resin was cured by ultraviolet irradiation. After that, the resin stamper 3 was separated as shown in FIG. 3D.

In a three-dimensional pattern formation process performed by ultraviolet imprinting, the resist residue remains on the bottoms of pattern recesses.

Then, the resist residue on the bottoms of pattern recesses was removed by RIE using oxygen gas. As shown in FIG. 3E, the magnetic recording layer was etched by Ar ion milling by using the patterns of the resist 7 as masks. Subsequently, as shown in FIG. 3F, the resist patterns were removed by oxygen RIE. In addition, a carbon protective layer (not shown) was formed on the entire surface. After that, the manufactured magnetic disk was coated with a lubricant.

In the magnetic disk medium described above, the magnetic recording layer was etched to the bottom in a portion where no resist mask was formed. However, it is also possible to stop Ar ion milling halfway to obtain a medium having projections and recesses. Alternatively, it is possible to obtain a medium by imprinting a stamper onto a resist on a substrate without initially forming any magnetic layer, giving a three-dimensional structure to the substrate shape by etching or the like, and then forming a magnetic film. Furthermore, in any medium including the above-mentioned media, the grooves may also be filled with a certain nonmagnetic material.

EXAMPLES

The present invention will be explained in detail below by way of its examples.

A resin stamper was duplicated by the above-mentioned method by using one Ni stamper, and ultraviolet-curing resin resist mask transfer was performed. 100 magnetic disks were duplicated for each ultraviolet-curing resin.

A resin stamper was duplicated by the above-mentioned method by using one Ni stamper, and ultraviolet-curing resin resist mask transfer was performed. Since 325-kTPI discrete track patterns were formed on the resin stamper, the patterns (a servo signal portion and data portion) were duplicated on the ultraviolet-curing resin resist. Grooves in the data portion of the resist patterns had a track pitch of 78 nm, a groove width of 10 nm, a land width of 68 nm, and a groove depth of 30 nm.

The ultraviolet-curing resin was evaluated for five items, i.e., the viscosity, hardness, property of separation, Ar sputter etching rate, and RRO (Repeatable Run Out).

The viscosity of the ultraviolet-curing resin was measured using a rotary viscometer (TVE-22LT manufactured by TOKI SANGYO).

The curing property was evaluated after transfer by wiping up the resin with a cloth wetted with ethanol. The evaluation was ⊚ when there was no change, ○ when there were two or more fine scratches, Δ when there were three or more scratches, and X when the wiped portion entirely peeled off.

The property of separation was evaluated as ○ when no 2P resin remained on the resin stamper after separation, Δ when the 2P resin slightly remained, and X when the 2P resin remained in a wide area.

The Ar sputter etching rate was measured by performing sputter etching in an Ar ambient at an Ar pressure of 1 Pa and an RF power of 100 W for 200 sec by using 51A Sputtering Equipment manufactured by SHIBAURA MECHATRONICS. Before and after the etching, the film thickness of the ultraviolet-curing resin was measured by using a DEKTAK 6M Stylus Surface Profiler manufactured by ULVAC. The etching rate was calculated by normalizing the difference between the film thicknesses before and after the etching by the etching time. The higher the etching resistance, the higher the processability when using the ultraviolet-curing resin. Therefore, the etching rate can be made as low as possible, e.g., can be 0.25 nm/sec or less.

The RRO is an effective means for checking the cure strain of the ultraviolet-curing resin. As the strain increases, the roundness of transferred patterns decreases, and the RRO tends to degrade. An evaluation apparatus for use in this evaluation is DDU-1000 manufactured by PULSTEC.

First, an ultraviolet-curing resin transfer pattern sample was prepared for RRO evaluation. A glass plate having an inner diameter of φ12.01 mm, an outer diameter of φ48.00 mm, and a thickness of 0.6 mm was spin-coated with KBM503 available from Shin-Etsu Chemical. In the same manner as in a normal magnetic recording medium transfer/separation process, the coating film was coated with an ultraviolet-curing resin, pattern transfer was performed using a resin stamper, and the resin stamper was separated from the glass plate. Since grooves having a track pitch of 400 nm were formed from a radius of 9 mm to a radius of 22 mm on the RRO measurement resin stamper used, the ultraviolet-curing resin patterns were duplicated on the glass substrate.

The RRO was evaluated by applying a laser from the side opposite to the transfer side of the ultraviolet-curing resin. The RRO is favorable when it is 1 nm or less.

An apparatus for checking the RRO of a three-dimensional pattern will be explained below.

FIG. 4 is a block diagram showing an outline of the arrangement of the RRO evaluation apparatus for checking the RRO.

A semiconductor laser source 120 is used as a light source. The wavelength of the exit light is in, e.g., the violet wavelength band within the range of 400 to 410 nm. Exit light 110 from the semiconductor laser source 120 is collimated into parallel light by a collimator lens 121, and this parallel light enters an objective lens 124 through a polarizing beam splitter 122 and λ/4 plate 123. After that, the light is transmitted through a substrate of sample S, and concentrated on a substrate surface in which grooves are formed. The numerical aperture (to be referred to as the NA hereinafter) of the laser changes in accordance with the medium as an object. For example, the NA is about 0.5 to 0.7 for this sample when using an evaluation method by which the laser is transmitted through the interior of a 0.6-mm thick transfer pattern sample. On the other hand, when using a sample made of a non-transmitting material or when reading the surface of the sample, it is possible to adjust the NA to 0.85 or more, or insert an aberration correcting plate equivalent to a 0.6-mm thick resin material between the laser and sample. Reflected light 111 from an information recording layer of the transfer pattern sample is transmitted through the substrate of transfer pattern sample S again, transmitted through the objective lens 124 and λ/4 plate 123, and reflected by the polarizing beam splitter 122. After that, the reflected light 111 enters a photodetector 127 through a condenser lens 125.

A light-receiving unit of the photodetector 127 is normally divided into a plurality of portions, and each light-receiving portion outputs an electric current corresponding to the light intensity. The output electric current is converted into a voltage by an I/V amplifier (current-voltage converter) (not shown), and the voltage is input to an arithmetic circuit 140. The arithmetic circuit 140 performs an arithmetic operation on the input voltage signal, thereby generating a tilt error signal, HF signal, focusing error signal, and tracking error signal. The tilt error signal is used to perform tilt control. The HF signal is used to reproduce recorded information. The focusing error signal is used to perform focusing control. The tracking error signal is used to perform tracking control.

The objective lens 124 can be driven in the vertical direction, disc radial direction, and tilt direction (radial direction or/and tangential direction) by an actuator 128, and is controlled to follow information tracks on transfer pattern sample S by a servo driver 150.

Note that in this evaluation apparatus, the wavelength of the semiconductor laser is in the range of 400 to 410 nm as an example. However, the present invention is not limited to this, and the wavelength can also be shorter. Note also that in this evaluation apparatus, the groove track pitch of the transfer pattern sample can be made smaller than, e.g., 0.4 μm. When the semiconductor laser has a long wavelength, the groove track pitch of the transfer pattern sample must be larger than 0.4 μm. The track pitch can be determined by the laser spot diameter. When performing tracking by using the push-pull method of the evaluation apparatus, the groove track pitch of the transfer pattern sample can be 0.5 to 1.2 times the laser spot diameter. The laser spot diameter can be represented by $\lambda/NA$. For example, when the laser wavelength is 405 nm and the NA is 0.65, the groove track pitch can be 0.31 to 0.75 μm. Also, when using, e.g., a fixed laser having a wavelength of 355 nm and an NA of 0.85, the laser spot diameter is 0.42 μm, so a minimal track pitch can be 0.2 μm. If the track pitch is too large, a dummy area expands, and the laser spot diameter of the evaluation apparatus tends to increase, so coarse evaluation is often performed on a data area. Therefore, the track pitch may be as small as possible. On the other hand, a laser wavelength shorter than 355 nm is impractical because it is difficult to handle. Accordingly, the lower limit of the groove track pitch can be 0.2 μm.

The transfer pattern sample of the present invention can be played back by using the RRO evaluation apparatus as described above. In this embodiment, PULSTEC DDU-1000 was used. The laser wavelength was 405 nm, and the NA was 0.65.

The method of evaluating the RRO of a transfer pattern sample will now be explained.

A transfer pattern sample was set in the above-mentioned evaluation apparatus and rotated at a linear velocity of 1.2 m/sec. Note that the linear velocity tends to decrease as the frequency rises (the servo gain characteristic) because the apparatus has the tracking characteristic. When the linear velocity is the lowest velocity equal to or higher than the minimal rotational speed of the spindle motor, therefore, a high-order component of the RRO can be checked more accurately by amplifying the displacement amount of the order. In this evaluation apparatus, one rotation of the disk is converted into a frequency as a rotational frequency, and the eccentric order is represented by this rotational frequency.

A laser was emitted, and the tilt and offset were adjusted such that the difference signal (push-pull signal) was maximum, thereby performing tracking. The frequency of the push-pull signal after tracking was analyzed using an FFT analyzer (CF-5210 manufactured by ONO SOKKI).

Then, the peak-to-peak value of the same push-pull signal was checked while tracking was turned off and only focusing was adjusted. This peak-to-peak voltage value is equivalent to a ½ rack pitch displacement amount. The displacement amount was calculated by dividing the voltage value at each frequency measured by the FFT analyzer by the peak-to-peak voltage value. Note that the measurement conditions of the FFT analyzer were that data obtained by measuring one track 100 times and averaging the results was regarded as one measurement, and a maximum value of the results of five measurements performed by changing tracks in a dummy area was regarded as the displacement amount. This calculation result was used as the RRO of the transfer pattern sample in the present invention. Assuming that the rotational frequency of the transfer pattern sample was the first-order displacement amount as a reference, attention was particularly given to the eighth-order to 40th-order displacement amounts. The RRO of less than the eighth order is not a problem because correction by tracking is possible when the order is less than the eighth order. Also, the RRO of an order larger than 40th order is not a problem because this RRO is originally small and cannot cause a tracking disturbance.

Although a transfer pattern sample by which the ratio of the land to the groove was 1:1 was used in the above example, the present invention is not limited to this. The characteristics of the apparatus for checking the RRO characteristic make tracking impossible to perform if PP/SUM <0.1 where PP/SUM is a value obtained by normalizing an amplitude (p–p) of a push-pull signal PP by a voltage value (p–G) of a sum signal SUM. Accordingly, it is possible to select a land-to-groove ratio at which tracking can be performed by preventing this.

Examples 1-30

Magnetic recording media were manufactured by transferring patterns onto magnetic recording layers by the above method by using ultraviolet-curing resins having compositions shown in Tables 1, 2, and 3 below.

The viscosity, curing property, property of separation, Ar sputter etching rate, and RRO of each ultraviolet-curing resin used were evaluated as described above. Tables 4 and 5 show the obtained results.

Examples of the ultraviolet-curing resins usable in the present invention and their abbreviations used in the tables are as follows.

IBOA: Isobornyl acrylate

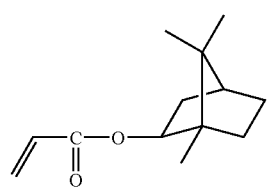

(1)

TITA: Tris(2-hydroxyethyl)isocyanurate triacrylate

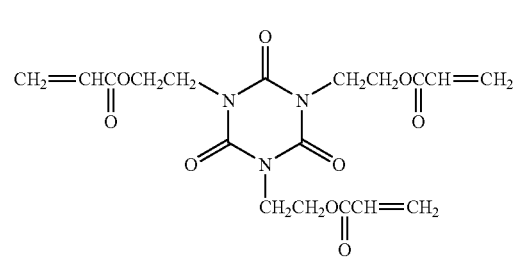

(5)

IRGACURE369: 2-benzyl-2-dimethylamino-1-(4-morpholinophenyl)-butanone-1

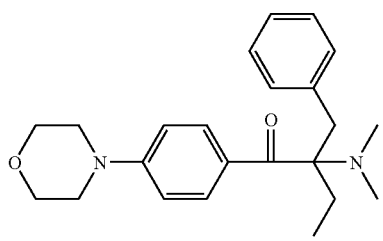
EGTA3: Ethoxylated (3) glyceryl triacrylate
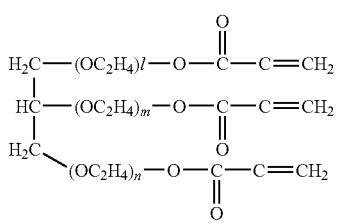
wherein l+m+n=3
EGTA9: Ethoxylated (9) glyceryl triacrylate
l+m+n=9 in formula (7) above
EGTA20: Ethoxylated (20) glyceryl triacrylate
l+m+n=20 in formula (7) above
TMPTA: Trimethylolpropane triacrylate
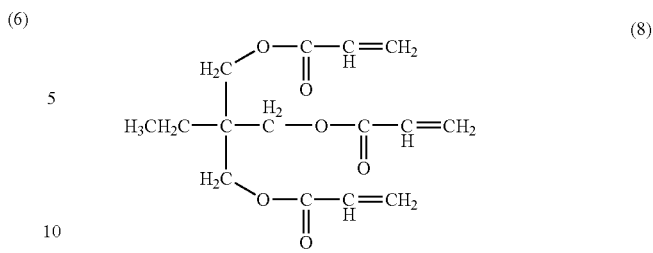
TMPTA-3EO: Ethoxylated (3) trimethylolpropane triacrylate
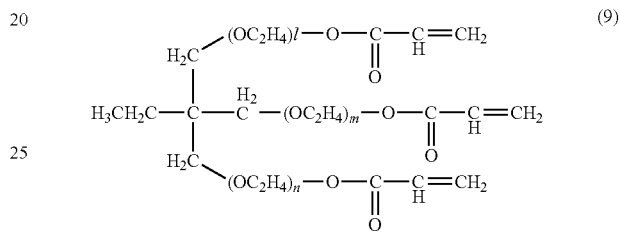
wherein l+m+n=3
PUHA: Polyurethane hexaacrylate
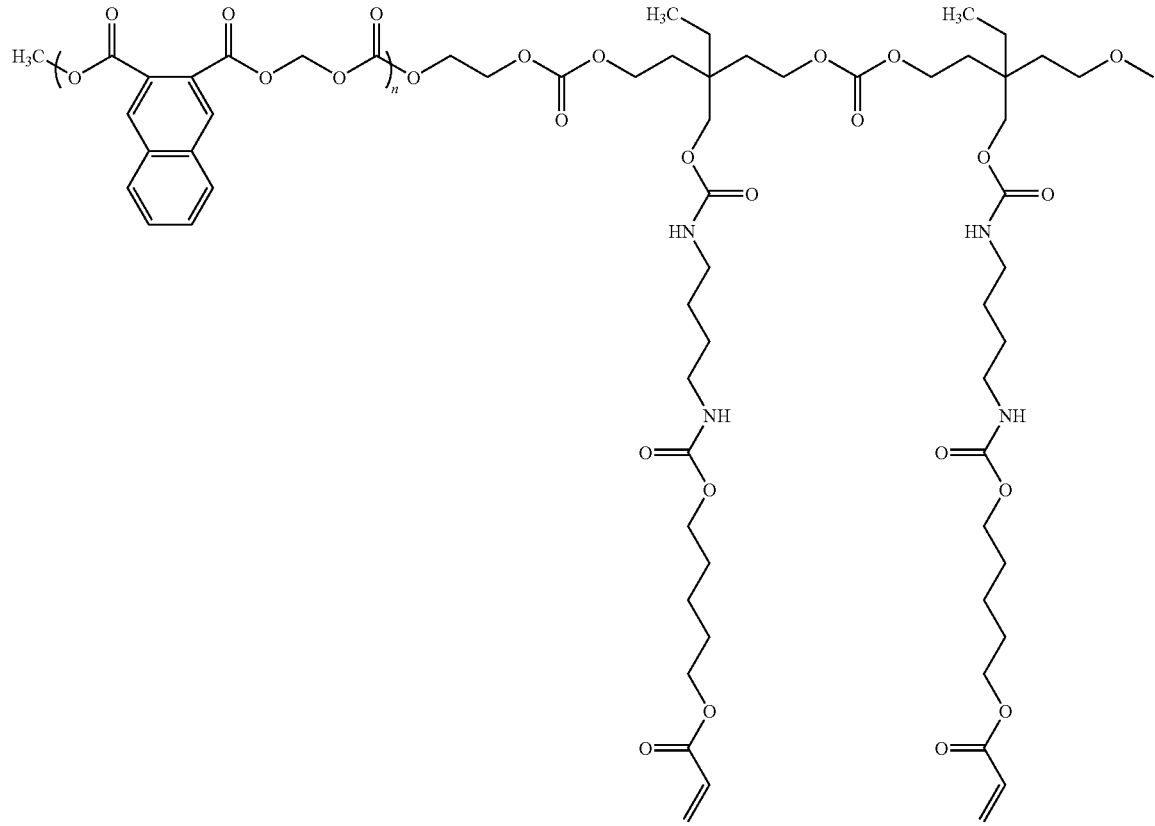

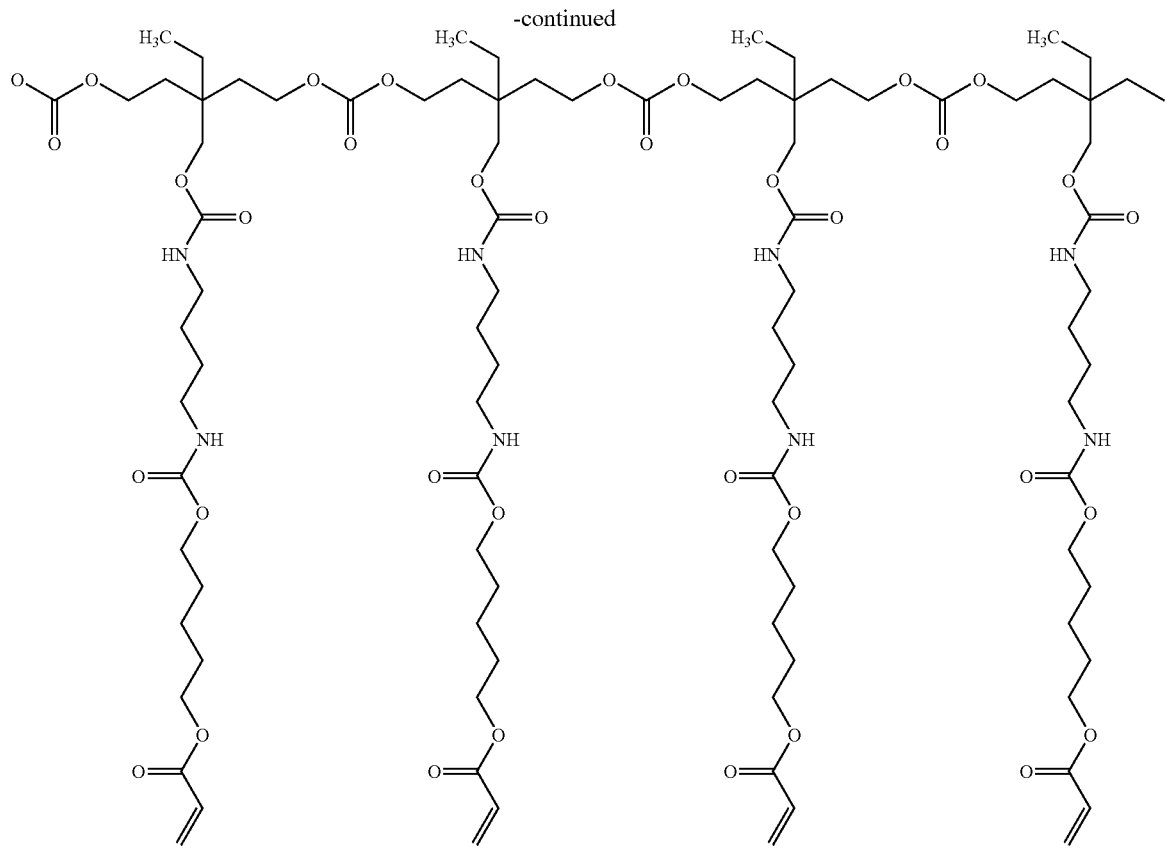
wherein n=25
TCDMA: Tricyclodecanedimethanol diacrylate
DTMPTA: Ditrimethylolpropane tetraacrylate
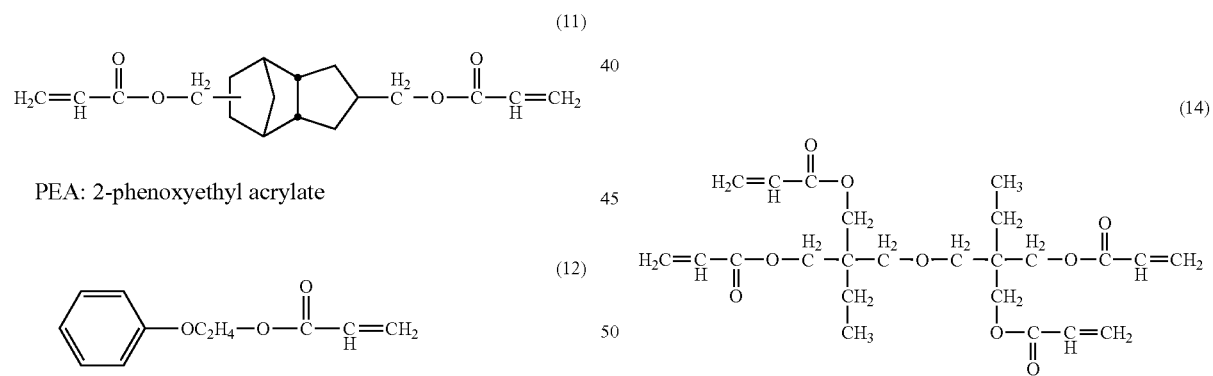
PEA: 2-phenoxyethyl acrylate
PBFA: Propoxylated bisphenol A glycidyl etherified acrylate
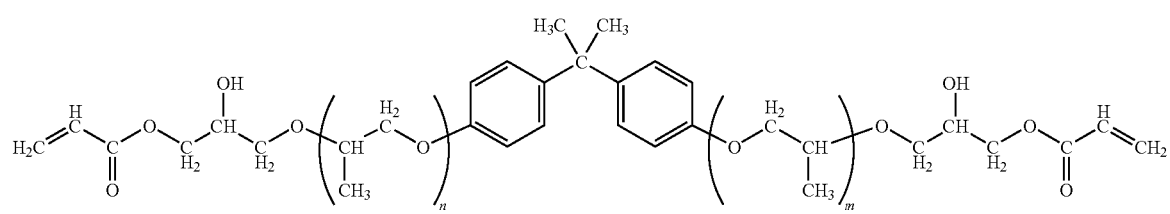

MADA: 2-methyl-2-adamantyl acrylate

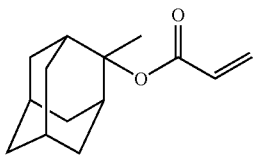

(2)

EADA: 2-ethyl-2-adamantyl acrylate

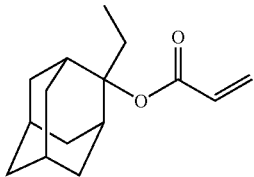

(3)

ADDA: 1,3-adamantanedimethanol diacrylate

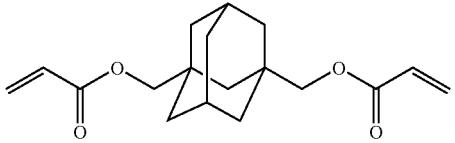

(4)

Ultraviolet-curing resins A, B, D, G, H, I, J, K, L, M, N, P, Q, T, X, Y, Z, and AA were found to be ultraviolet-curing resins suitably used to transfer patterns onto a magnetic recording medium in respect of all of the viscosity, property of separation, curing property, film thickness, and etching rate. When discrete magnetic recording media were manufactured by using these ultraviolet-curing resins, it was highly possible to transfer patterns. Also, DTR media were manufactured by using the good ultraviolet-curing resins, and the recording/reproduction characteristics were checked. Consequently, favorable characteristics were obtained. C and F were inferior in both etching resistance and curing property. O was inferior in both property of separation and curing property. V and W were inferior in property of separation. In addition, F, O, and V were found to have large RRO values.

Accordingly, it is difficult to achieve a high etching resistance and good curing property at the same time without any adamantyl acrylate.

It was also attempted to prepare a resist by dissolving the ultraviolet-curing resin in an organic solvent. It is readily possible to decrease the viscosity of this resist prepared by dissolving the ultraviolet-curing resin in an organic solvent, and the solvent volatilizes during spin coating. This facilitates controlling the film thickness in accordance with the spin conditions, and increases the uniformity of the film thickness from the inner periphery to the outer periphery.

As the organic solvent, it is possible to use, e.g., ethyl alcohol, methyl alcohol, isopropyl alcohol, polyethylene glycol monomethyl ether acetate (PEGMEA), ethyl lactate, or anisole. When using polycarbonate as a resin stamper, however, polycarbonate sometimes dissolves during bonding. Polycarbonate does not dissolve when using diacetone alcohol, dibutyl ether, or fluorinated alcohol as the solvent. Especially, when using the fluorinated alcohol as the solvent, the spin coating film thickness uniformity increases, and the amount of residual solvent after spin coating is very small. Examples of the fluorinated alcohol are 2,2,3,3-tetrafluoro-1-propanol (TFP) (e.g., A-5210 manufactured by Daikin Fine Chemical Laboratories: $H(CF_2)_2CH_2OH$), 2,2,3,3,4,4,5,5-octafluoro-1-pentanol (e.g., A-5410-manufactured by Daikin Fine Chemical Laboratories: $H(CF_2)_2CH_2OH$), and other fluorinated alcohols (A-1210: $F(CF_2)_2CH_2OH$, A-1420: $F(CF_2)_4CH_2CH_2OH$, and A-1620: $F(CF_2)_6CH_2CH_2OH$ manufactured by Daikin Fine Chemical Laboratories). 2,2,3,3-tetrafluoro-1-propanol (TFP) is most favorable because the evaporation rate is high, the viscosity is low, and the solubility of the ultraviolet-curing resin is high. A small amount (about 10 wt % or less) of an ultraviolet-curing resin stock solution is dissolved in the solvent. This dissolution can be performed by using agitation, an ultrasonic wave method, or the like.

As Examples 26, 27, 28, 29, and 30, resists were prepared by dissolving the ultraviolet-curing resins in TFP, and evaluated following the same procedures as in Example 1. Table 3 shows the results. The experimental results indicate that the resists were superior in all items, and particularly superior in etching resistance and RRO.

Note that although IRGACURE369 was used as the polymerization initiator in the examples, it is naturally possible to appropriately select any polymerization initiator in accordance with the affinity to the UV lamp or acrylate.

TABLE 1

|  | Resin | IBOA (wt %) | Adamantyl acrylate | Polyfunctional acrylate | Polymerization initiator IRGACURE 369 |
|---|---|---|---|---|---|
| Example 1 | A | 85 | MADA 6 wt % | TMPTA 5 wt % | 4 wt % |
| Example 2 | B | 90 | MADA 3 wt % | TMPTA 5 wt % | 2 wt % |
| Comparative Example 1 | C | 90 | — | TMPTA 6 wt % | 4 wt % |
| Example 3 | D | 85 | EADA 5 wt % | TMPTA 7 wt % | 3 wt % |
| Example 4 | E | 90 | EADA 2 wt % | TMPTA 5 wt % | 3 wt % |
| Comparative Example 2 | F | 92 | — | PBFA 5 wt % | 3 wt % |
| Example 5 | G | 90 | EADA 2 wt % | PBFA 5 wt % | 3 wt % |
| Example 6 | H | 90 | ADDA 2 wt % | TMPTA 5 wt % | 3 wt % |
| Example 7 | I | 87 | ADDA 4 wt % | EGTA9 6 wt % | 3 wt % |
| Example 8 | J | 90 | ADDA 3 wt % | PBFA 4 wt % | 3 wt % |
| Example 9 | K | 85 | MADA 8 wt % | DTMPTA 4 wt % | 3 wt % |
| Example 10 | L | 80 | MADA 8 wt % | TMPTA 8 wt % | 4 wt % |
| Example 11 | M | 95 | MADA 2 wt % | TMPTA 2 wt % | 1 wt % |
| Example 12 | N | 78 | MADA 10 wt % | TMPTA 10 wt % | 2 wt % |
| Example 13 | O | 97 | MADA 1 wt % | TMPTA 1 wt % | 1 wt % |

TABLE 1-continued

|  | Resin | IBOA (wt %) | Adamantyl acrylate | Polyfunctional acrylate | Polymerization initiator IRGACURE 369 |
|---|---|---|---|---|---|
| Example 14 | P | 90 | MADA 1 wt % | TMPTA 5 wt % | 3 wt % |
| Example 15 | Q | 80 | MADA 15 wt % | TMPTA 3 wt % | 2 wt % |
| Example 16 | R | 90.2 | MADA 0.8 wt % | TMPTA 5 wt % | 3 wt % |
| Example 17 | S | 80 | MADA 17 wt % | TMPTA 2 wt % | 1 wt % |
| Example 18 | T | 90 | MADA 5 wt % | TMPTA 1 wt % | 3 wt % |
| Example 19 | U | 80 | MADA 3 wt % | TMPTA 15 wt % | 2 wt % |
| Example 20 | V | 90.2 | MADA 5 wt % | TMPTA 0.8 wt % | 3 wt % |
| Example 21 | W | 80 | MADA 2 wt % | TMPTA 17 wt % | 1 wt % |

TABLE 2

|  |  | Resin | IBOA (wt %) | Adamantyl acrylate (wt %) | | | Polyfunctional acrylate | Polymerization initiator IRGACURE 369 (wt %) |
|---|---|---|---|---|---|---|---|---|
|  |  |  |  | MADA | EADA | ADDA | TMPTA |  |
| Example | 22 | X | 90 | 2.5 | 2.5 | — | 2 | 3 |
|  | 23 | Y | 90 | 2.5 | — | 2.5 | 2 | 2 |
|  | 24 | Z | 90 | 2 | 2 | 2 | 2 | 3 |
|  | 25 | AA | 90 | — | 2.5 | 2.5 | 2 | 3 |

TABLE 3

|  |  | Resin | IBOA (wt %) | Adamantyl acrylate MADA (wt %) | Polyfunctional acrylate TMPTA (wt %) | Ultraviolet-curing resin material stock solution viscosity | TFP addition concentration (wt %) |
|---|---|---|---|---|---|---|---|
| Example | 26 | BB | 48 | 2 | 49 | 96 (cP) | 3 |
|  | 27 | CC | 37 | 5 | 57 | 192 (cP) | 2.5 |
|  | 28 | DD | 30 | 10 | 59 | 328 (cP) | 2.1 |
|  | 29 | EE | 20 | 20 | 59 | 710 (cP) | 1.8 |
|  | 30 | FF | 10 | 30 | 59 | 1600 (cP) | 1.5 |

TABLE 4

|  | Resin | Viscosity (CP) | Property of separation | Curing property | Film thickness (nm) | Etching rate (nm/sec) |
|---|---|---|---|---|---|---|
| Example 1 | A | 12 | ○ | ○ | 47 | 0.02 ○ |
| Example 2 | B | 10 | ○ | ○ | 44 | 0.03 ○ |
| Comparative Example 1 | C | 10 | ○ | Δ | 43 | 0.14 X |
| Example 3 | D | 13 | ○ | ○ | 51 | 0.08 ○ |
| Example 4 | E | 11 | ○ | ○ | 48 | 0.07 ○ |
| Comparative Example 2 | F | 11 | ○ | Δ | 47 | 0.15 X |
| Example 5 | G | 12 | ○ | ○ | 50 | 0.07 ○ |
| Example 6 | H | 11 | ○ | ○ | 48 | 0.09 ○ |
| Example 7 | I | 13 | ○ | ○ | 50 | 0.08 ○ |
| Example 8 | J | 12 | ○ | ○ | 49 | 0.09 ○ |
| Example 9 | K | 12 | ○ | ○ | 47 | 0.01 ○ |
| Example 10 | L | 13 | ○ | ○ | 50 | 0.08 ○ |
| Example 11 | M | 10 | ○ | ○ | 43 | 0.03 ○ |
| Example 12 | N | 20 | Δ | Δ | 56 | 0.09 ○ |
| Example 13 | O | 9 | X | X | 40 | 0.09 ○ |
| Example 14 | P | 12 | ○ | ○ | 48 | 0.05 ○ |
| Example 15 | Q | 13 | ○ | ○ | 50 | 0.07 ○ |
| Example 16 | R | 12 | X | ○ | 47 | 1.05 X |
| Example 17 | S | 14 | ○ | ○ | 50 | 1.05 X |
| Example 18 | T | 11 | ○ | ○ | 47 | 0.06 ○ |
| Example 19 | U | 12 | ○ | X | 48 | 0.09 ○ |
| Example 20 | V | 10 | X | ○ | 45 | 0.09 ○ |

TABLE 4-continued

|  | Resin | Viscosity (CP) | Property of separation | Curing property | Film thickness (nm) | Etching rate (nm/sec) |
|---|---|---|---|---|---|---|
| Example 21 | W | 14 | X | ○ | 50 | 0.09 ○ |
| Example 22 | X | 10 | ○ | ○ | 44 | 0.08 ○ |
| Example 23 | Y | 11 | ○ | ○ | 46 | 0.09 ○ |
| Example 24 | Z | 10 | ○ | ○ | 45 | 0.07 ○ |
| Example 25 | AA | 10 | ○ | ○ | 45 | 0.09 ○ |
| Example 26 | BB | 4 | ○ | ○ | 45 | 0.03 ○ |
| Example 27 | CC | 4 | ○ | ○ | 45 | 0.02 ○ |
| Example 28 | DD | 4 | ○ | ○ | 45 | 0.01 ○ |
| Example 29 | EE | 4 | ○ | ○ | 45 | 0.01 ○ |
| Example 30 | FF | 4 | ○ | ○ | 45 | 0.02 ○ |

TABLE 5

|  | Resin | Etching rate determination | 8th-order (nm) | 24th-order (nm) | 40th-order (nm) | RRO determination |
|---|---|---|---|---|---|---|
| Example 1 | A | ○ | 0.2 | 0.2 | 0.1 | ○ |
| Example 2 | B | ○ | 0.2 | 0.1 | 0.1 | ○ |
| Comparative Example 1 | C | X | 0.3 | 0.2 | 0.1 | ○ |
| Example 3 | D | ○ | 0.4 | 0.3 | 0.2 | ○ |
| Example 4 | E | ○ | 0.3 | 0.2 | 0.2 | ○ |
| Comparative Example 2 | F | X | 2 | 1.5 | 1 | X |
| Example 5 | G | ○ | 0.9 | 0.8 | 0.8 | ○ |
| Example 6 | H | ○ | 0.4 | 0.3 | 0.1 | ○ |
| Example 7 | I | ○ | 0.2 | 0.2 | 0.1 | ○ |
| Example 8 | J | ○ | 0.9 | 0.8 | 0.8 | ○ |
| Example 9 | K | ○ | 0.4 | 0.3 | 0.2 | ○ |
| Example 10 | L | ○ | 0.3 | 0.2 | 0.2 | ○ |
| Example 11 | M | ○ | 0.3 | 0.2 | 0.1 | ○ |
| Example 12 | N | ○ | 0.5 | 0.4 | 0.3 | ○ |
| Example 13 | O | ○ | 1.2 | 1.1 | 1 | X |
| Example 14 | P | ○ | 0.8 | 0.7 | 0.4 | ○ |
| Example 15 | Q | ○ | 0.3 | 0.2 | 0.1 | ○ |
| Example 16 | R | X | 0.7 | 0.6 | 0.3 | ○ |
| Example 17 | S | X | 0.3 | 0.2 | 0.1 | ○ |
| Example 18 | T | ○ | 0.5 | 0.3 | 0.2 | ○ |
| Example 19 | U | ○ | 0.6 | 0.5 | 0.3 | ○ |
| Example 20 | V | ○ | 1.3 | 1.2 | 1.1 | X |
| Example 21 | W | ○ | 0.8 | 0.7 | 0.5 | ○ |
| Example 22 | X | ○ | 0.3 | 0.2 | 0.1 | ○ |
| Example 23 | Y | ○ | 0.2 | 0.1 | 0.1 | ○ |
| Example 24 | Z | ○ | 0.2 | 0.1 | 0.1 | ○ |
| Example 25 | AA | ○ | 0.5 | 0.4 | 0.2 | ○ |
| Example 26 | BB | ○ | 0.1 | 0.1 | 0.05 | ○ |
| Example 27 | CC | ○ | 0.1 | 0.1 | 0.05 | ○ |
| Example 28 | DD | ○ | 0.1 | 0.1 | 0.05 | ○ |
| Example 29 | EE | ○ | 0.1 | 0.1 | 0.05 | ○ |
| Example 30 | FF | ○ | 0.1 | 0.1 | 0.05 | ○ |

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An ultraviolet-curing resin material for pattern transfer comprising:
 at least one type of adamantyl acrylate selected from the group consisting of 2-methyl-2-adamantyl acrylate, 2-ethyl-2-adamantyl acrylate, and 1,3-adamantanedimethanol diacrylate;
 isobornyl acrylate;
 polyfunctional acrylate; and
 a polymerization initiator,
 wherein the content of the adamantyl acrylate is 1 to 15 wt %, the content of the isobornyl acrylate is 80 to 95 wt %, the content of the polyfunctional acrylate is 1 to 15 wt %, and the content of the polymerization initiator is 0.5 to 5 wt %.

2. An ultraviolet-curing resin material for pattern transfer comprising:
 at least one acrylate selected from the group consisting of:
  adamantyl acrylate, selected from the group consisting of 2-methyl-2-adamantyl acrylate, 2-ethyl-2-adamantyl acrylate, and 1,3-adamantanedimethanol diacrylate,
isobornyl acrylate, and
polyfunctional acrylate;
a polymerization initiator; and
fluorine-based alcohol,
wherein the content of the adamantyl acrylate is 1 to 15 wt %, the content of the isobornyl acrylate is 80 to 95 wt %, the content of the polyfunctional acrylate is 1 to 15 wt %, and the content of the polymerization initiator is 0.5 to 5 wt %.

3. A magnetic recording medium manufacturing method comprising:
contacting, under a vacuum, a surface of a magnetic recording layer of a magnetic recording medium comprising a data area and a servo area, and a three-dimensional pattern surface of a resin stamper, with an uncured ultraviolet-curing resin coating layer for pattern transfer comprising at least one type of adamantyl acrylate selected from the group consisting of 2-methyl-2-adamantyl acrylate, 2-ethyl-2-adamantyl acrylate, and 1,3-adamantanedimethanol diacrylate, isobornyl acrylate, polyfunctional acrylate, and a polymerization initiator being interposed between the surface of the magnetic recording layer and the three-dimensional pattern surface;
curing the uncured ultraviolet-curing resin coating layer by ultraviolet irradiation;
separating the resin stamper to form a cured ultraviolet-curing resin material layer comprising a transferred three-dimensional pattern on one surface of the magnetic recording medium; and
dry etching with the cured ultraviolet-curing resin material layer as a mask to form a three-dimensional pattern on the surface of the magnetic recording layer,
wherein the content of the adamantyl acrylate is 1 to 15 wt %, the content of the isobornyl acrylate is 80 to 95 wt %, the content of the polyfunctional acrylate is 1 to 15 wt %, and the content of the polymerization initiator is 0.5 to 5 wt %.

4. A magnetic recording medium manufacturing method comprising:
contacting under a vacuum, a surface of a magnetic recording layer of a magnetic recording medium comprising a data area and a servo area, and a three-dimensional pattern surface of a resin stamper, with an uncured ultraviolet-curing resin coating layer for pattern transfer comprising at least one acrylate selected from the group consisting of adamantyl acrylate selected from the group consisting of 2-methyl-2-adamantyl acrylate, 2-ethyl-2-adamantyl acrylate, and 1,3-adamantanedimethanol diacrylate, isobornyl acrylate, and polyfunctional acrylate, a polymerization initiator, and fluorine-based alcohol being interposed between the surface of the magnetic recording layer and the three-dimensional pattern surface;
curing the uncured ultraviolet-curing resin coating layer with ultraviolet irradiation;
separating the resin stamper to form a cured ultraviolet-curing resin material layer comprising a transferred three-dimensional pattern on one surface of the magnetic recording medium; and
dry etching with the cured ultraviolet-curing resin material layer as a mask to form a three-dimensional pattern on the surface of the magnetic recording layer,
wherein the content of the adamantyl acrylate is 1 to 15 wt %, the content of the isobornyl acrylate is 80 to 95 wt %, the content of the polyfunctional acrylate is 1 to 15 wt %, and the content of the polymerization initiator is 0.5 to 5 wt %.

\* \* \* \* \*